United States Patent [19]

Ishikawa et al.

[11] Patent Number: 5,640,696

[45] Date of Patent: Jun. 17, 1997

[54] AUTOMATIC STATION SELECTING AND RECEIVING APPARATUS AND AUTOMATIC STATION SELECTING AND RECEIVING METHOD

[75] Inventors: Yutaro Ishikawa; Toshiyuki Kimura, both of Kawagoe, Japan

[73] Assignee: Pioneer Electronic Corporation, Tokyo-to, Japan

[21] Appl. No.: 400,567

[22] Filed: Mar. 8, 1995

[30] Foreign Application Priority Data

Mar. 10, 1994 [JP] Japan ................................. 6-039919

[51] Int. Cl.$^6$ ................................................. H04B 1/18
[52] U.S. Cl. ............................... 455/186.2; 455/161.1; 455/161.3; 455/186.1
[58] Field of Search ........................ 455/33.2, 67.6, 455/161.1, 161.2, 162.3, 185.1, 186.1, 186.2, 226.2, 161.3

[56] References Cited

U.S. PATENT DOCUMENTS

| | | |
|---|---|---|
| 4,856,082 | 8/1989 | Kasa . |
| 5,152,011 | 9/1992 | Schwob ............................ 455/186.1 |
| 5,280,642 | 1/1994 | Hirata et al. . |
| 5,307,513 | 4/1994 | Harada ............................. 455/186.1 |

FOREIGN PATENT DOCUMENTS

| | | |
|---|---|---|
| 0387810 | 9/1990 | European Pat. Off. . |
| 1-117529 | 5/1989 | Japan . |
| 2-238723 | 9/1990 | Japan . |

*Primary Examiner*—Edward F. Urban
*Assistant Examiner*—Gertrude Arthur
*Attorney, Agent, or Firm*—Young & Thompson

[57] ABSTRACT

An automatic station selecting and receiving apparatus mounted on a movable body is provided with: a memory unit for storing information indicating a tendency of programs and information indicating a broadcast frequency as for each of the broadcasting stations in association with a plurality of regional blocks obtained by dividing a whole region, where the broadcasting stations exist, into a plurality of blocks; an operation unit for specifying a desirable tendency of programs to be received; a current block detection unit for detecting one regional block including a position where the movable body is currently positioned; a station selection unit for selecting one of broadcasting stations, which is positioned in the detected one regional block and which has the specified tendency of programs, according to the stored information indicating the tendency of programs; and a receiving unit for receiving an electric wave of the broadcast frequency corresponding the selected one of the broadcasting stations according to the stored information indicating the broadcast frequency.

10 Claims, 3 Drawing Sheets

AUTOMATIC STATION SELECTING AND RECEIVING APPARATUS AND AUTOMATIC STATION SELECTING AND RECEIVING METHOD

BACKGROUND OF THE INVENTION

1. Field of the Invention

The present invention generally relates to a so called automatic station selecting and receiving apparatus, which automatically selects a broadcasting station according to so called "format information" on the basis of various information related to broadcasting stations (e.g. broadcast frequency information, broadcasting genre, broadcasting station name) stored in a memory in advance, and more particularly to an automatic updating operation of a current position of a movable body such as a car or vehicle to perform a format scanning operation.

2. Description of the Related Art

The number of FM (Frequency Modulation) broadcasting stations have increased nowadays, and the broadcast contents of the broadcasting stations are variegated. There exists a broadcasting station, which broadcasts only specific music (e.g. only Jazz, only Rock) for almost all of the broadcasting time of the day, and a broadcasting station, which has a major object to serve information such as news. In the U.S.A., where the number of broadcasting stations is very large, this variegation is even more promoted. This tendency of stations to broadcast only specific music or information is called a "format", and the information indicating this format corresponding to the broadcasting station is called "format information". Under this circumstance, there is a receiving system, which stores the format information with respect to each broadcasting station in advance, which determines the format information corresponding to the broadcasting station from the broadcast frequency etc. of the broadcasting station which electric wave is being received, and which supplies the users with the information. By use of this system, the user can selectively receive only the program from the broadcasting station or stations corresponding to the desired format (i.e. the desired tendency of programs). As for the receiving apparatus mounted on a movable body such as a car radio, since the condition of the broadcast electric wave which is being received varies from time to time, the station selection technique using this format information is important.

The receiving apparatus by use of the format information (which is referred to as an automatic station selecting and receiving apparatus, hereinbelow) stores the database related to the format information and the station name information in its internal memory. This database consists of a state file, a city file, a grid file, etc., which are regionally systemized. Here, the "grid" means a plurality of blocks, which are obtained by dividing the region in the vicinity of the receiving apparatus in a lattice like manner, and each of which has a constant area, for the sake of the receiving apparatus to efficiently perform the searching operation.

FIG. 3 shows one example of the construction of this grid.

In FIG. 3, the region in the vicinity of the receiving apparatus is divided into blocks in a lattice like manner, and a grid X is assumed to be a current grid (which means a grid in which the receiving apparatus is currently moving), and grids A to H around the grid X are grids in the region to which the receiving apparatus can access. The size of one grid is determined in accordance with the properties of the service area of the broadcasting station and the movable body (e.g. moving speed). For example, it is determined to be a 30 km square area.

In this type of automatic station selecting and receiving apparatus, the selection operation called a "format scanning operation" is performed. Namely, the receiving apparatus detects a broadcasting station or stations, from which the receiving apparatus can receive the electric wave, by seeking up or seeking down the receiving frequency on the basis of the format selected by the user. From the frequency information of the detected broadcasting station, the format information corresponding to this detected broadcasting station is read out from the memory. At this time, if the format specified by the user (for example, "Jazz" is specified as the format by the user) and the format information of the currently sought broadcasting station are not coincident with each other, the next broadcasting station will be sought. If they are coincident with each other, the seeking operation is ended, and the broadcasting station information is read out from the memory to be displayed on a display unit, and the receiving operation is continued by the frequency. The object region or area of this seeking operation may be limited within the current grid, or may be wider region than that.

In this type of automatic station selecting and receiving apparatus, the user uses an operation panel as shown in FIG. 4, to update the current grid in accordance with the movement of the movable body. By the operation of an operation panel 100 in FIG. 4, the region where the receiving apparatus recognizes the current position is determined and updated. After that, the station name information, the format information etc., can be accessed by the grid file in correspondence with the receiving frequency. For example, if the receiving condition is degraded as the automobile advances to the northeast direction, the user presses "N" and "E" keys on the operation panel 100 in FIG. 4, so that the current grid is updated to be the C grid in FIG. 3. The receiving apparatus sets the 9 grids with the C grid located at the center thereof as a next region (grid) to be accessed.

On the other hand, there is used a so called automatic format scanning (AFS) operation, in which the broadcast electric waves from the broadcasting stations having formats identical to each other are switched one after another to be received. In case that this automatic format scanning operation is performed by the specification of the user, the automatic format scanning operation is performed on an assumption that the position where the receiving apparatus is really positioned and the current grid set in the receiving apparatus are consistent with each other.

The above types of automatic station selecting and receiving apparatuses are disclosed in Japanese Patent Laid Open Nos. Hei.1-117,529 and Hei.2-238,723.

Furthermore, there is another type of automatic station selecting and receiving apparatus which performs the automatic grid updating operation to specify the current grid by use of the receiving condition and the data base.

However, in the above explained automatic grid updating or setting operation, since the movement of the movable body is not detected, the process to automatically updating or setting the grid is performed by the keying operation of the user. Namely, when the receiving apparatus gets away from the service area of the broadcasting station, which electric wave has been received by the receiving apparatus, in accordance with the movement of the automobile, there is raised such a problem that the user should specify the current position by operating the operation panel by himself to update the current grid.

More concretely, the user recognizes the degradation of the sounds as the noises are frequently mixed into the broadcasted sound or as the mute circuit of the FM receiving apparatus frequently operates, so that he is informed that the receiving condition of the broadcast which he is listening to is degraded. Thus, even if the receiving apparatus is an automatic station selecting and receiving apparatus which has the current position updating function to seek the current grid automatically, the updating operation of the current position should be performed by the user's operation after recognizing the degradation of the receiving condition by the virtue of the noise etc. Particularly, if the automobile on which the receiving apparatus is mounted is moving at a high speed on a highway, this updating operation should be performed quite frequently, which is quite troublesome and difficult for the user.

In case that the automobile is driven while the electric power of the receiving apparatus is turned off for a while, when the power of the receiving apparatus is turned on, there rises a case where the current grid setting and the actual position of the receiving apparatus are not consistent with each other. If the reception is continued as it is, since the electric wave of the pertinent broadcasting station which is the receiving object is very weak, the automatic format scanning operation cannot be normally executed, which is another serious problem.

SUMMARY OF THE INVENTION

It is therefore an object of the present invention to provide an automatic station selecting and receiving apparatus and method, which can perform the automatic grid setting and updating operation at an appropriate time.

The above object of the present invention can be achieved by an automatic station selecting and receiving apparatus mounted on a movable body provided with: a memory unit for storing information indicating a tendency of programs for each of the broadcasting stations and information indicating a broadcast frequency for each of the broadcasting stations in association with a plurality of regional blocks obtained by dividing a whole region, where the broadcasting stations exist, into a plurality of blocks; an operation unit for specifying a desirable tendency of programs to be received; a current block detection unit for detecting one regional block including a position where the movable body is currently positioned; a station selection unit for selecting one of the broadcasting stations, which is positioned in one regional block detected by the current block detection unit and which has the tendency of programs specified by the operation unit, according to the information indicating the tendency of programs stored in the memory unit; and a receiving unit for receiving an electric wave of the broadcast frequency corresponding the selected one of the broadcasting stations according to the information indicating the broadcast frequency stored in the memory unit.

The aforementioned problems according to the related arts are based on the fact that the movement of the automobile on which the receiving apparatus is mounted cannot be detected. According to the apparatus of the present invention, when a desirable tendency of programs is specified by the operation unit, the current block detection unit detects one regional block including a position where the movable body is currently positioned. Then, the station selection unit selects one of broadcasting stations, which is positioned in the detected one regional block and which has the specified tendency of programs, according to the information indicating the tendency of programs stored in the memory unit. Finally, the receiving unit receives an electric wave of the broadcast frequency corresponding the selected one of the broadcasting stations according to the information indicating the broadcast frequency stored in the memory unit.

Thus, the station selection can be automatically performed in accordance with the movement of the movable body while only programs having the desirable tendency is received in a good receiving condition. It is not necessary for the user to specify the direction of the movement of the movable body as explained with FIG. 4, according to the present invention.

In one aspect of the apparatus of the present invention, the current block detection unit includes a judgment unit for judging whether a level of the received electric wave is higher than a predetermined threshold level or not, and re-detects one regional block if the judgment unit judges that the level of the received electric wave is not higher than the predetermined threshold level. Thus, the degradation in the receiving condition can be reflected to the detection of the current block, so that the detection of the current block can be performed at the appropriate time. In this aspect of the apparatus of the present invention, the station selection unit preferably re-selects one of broadcasting stations, which is positioned in one regional block re-detected by the current block detection unit. Thus, the station selection as well as the detection of the current block can be performed at the appropriate time. In this aspect of the apparatus of the present invention, the receiving unit may include an antenna, a tuner and a demodulation circuit, and the judgment unit judges whether a signal level received at a tuner as the level of the received electric wave is higher than the predetermined threshold level or not. Further, in this aspect of the apparatus of the present invention, the predetermined threshold level is predetermined as a function of a level of a noise generated in the received electric signal due to a distance from the automatic station selecting and receiving apparatus to the broadcasting station corresponding to the received electric wave. Thus, it becomes possible to prevent the user from listening to noisy sound, since the station selection is performed before the noise is practically sensed by the user.

In another aspect of the apparatus of the present invention, the station selection unit selects one of the broadcasting stations with reference to the information indicating the tendency of programs only related to the broadcasting stations in the detected one regional block. Thus, the selecting operation by the station selection unit can be speedily performed since the information related to many broadcasting stations in other regional blocks are not referred to.

In another aspect of the apparatus of the present invention, the current block detection unit detects one regional block on the basis of levels of electric waves from the broadcasting stations, which are located in the detected one regional block and in regional blocks around the detected one regional block, received by the receiving unit. Thus, the block detection can be performed by the best use of the received signals.

The above object of the present invention can be also achieved by an automatic station selecting and receiving method used for the above described automatic station selecting and receiving apparatus of the present invention. The method is provided with the steps of: storing information indicating a tendency of programs for each of the broadcasting stations and information indicating a broadcast frequency for each of the broadcasting stations in association with a plurality of regional blocks obtained by dividing a whole region, where the broadcasting stations exist, into a plurality of blocks; specifying a desirable tendency of programs to be received; detecting one regional block including a position where the movable body is currently positioned; selecting one of broadcasting stations, which is positioned in the detected regional block and which has the specified tendency of programs, according to the stored information indicating the tendency of programs; and receiving an electric wave of the broadcast frequency corresponding the selected one of the broadcasting stations according to the stored information indicating the broadcast frequency. Accordingly, the advantage of the aforementioned apparatus of the present invention can be achieved by the method of the present invention in the same manner.

In one aspect of the method of the present invention, the current block detecting step includes the step of judging whether a level of the received electric wave is higher than a predetermined threshold level or not, and re-detecting one regional block if the level of the received electric wave is not judged to be higher than the predetermined threshold level. Thus, the degradation in the receiving condition can be reflected to the detection of the current block, the detection of the current block can be performed at the appropriate time. In this aspect of the method of the present invention, the station selecting step may preferably include the step of re-selecting one of broadcasting stations, which is positioned in the re-detected regional block. Thus, the station selection as well as the detection of the current block can be performed at the appropriate time. In this aspect of the method of the present invention, the predetermined threshold level may be predetermined as a function of a level of a noise generated in the received electric signal due to a distance from the automatic station selecting and receiving apparatus to the broadcasting station corresponding to the received electric wave. Thus, it becomes possible to prevent the user from listening to noisy sound, since the station selection is performed before the noise is practically sensed by the user.

In another aspect of the method of the present invention, the current block detecting step includes the step of detecting one regional block on the basis of levels of received electric waves from the broadcasting stations, which are located in the detected regional block and in regional blocks around the detected regional block. Thus, the block detection can be performed by the best use of the received signals.

The nature, utility, and further features of this invention will be more clearly apparent from the following detailed description with respect to preferred embodiments of the invention when read in conjunction with the accompanying drawings briefly described below.

DETAILED DESCRIPTION OF THE PREFERRED EMBODIMENTS

Referring to the accompanying drawings, an embodiment of the present invention will be now explained. The embodiment is such an example that the present invention is applied to an on-vehicle radio receiving apparatus for an automobile.

Figure 1:
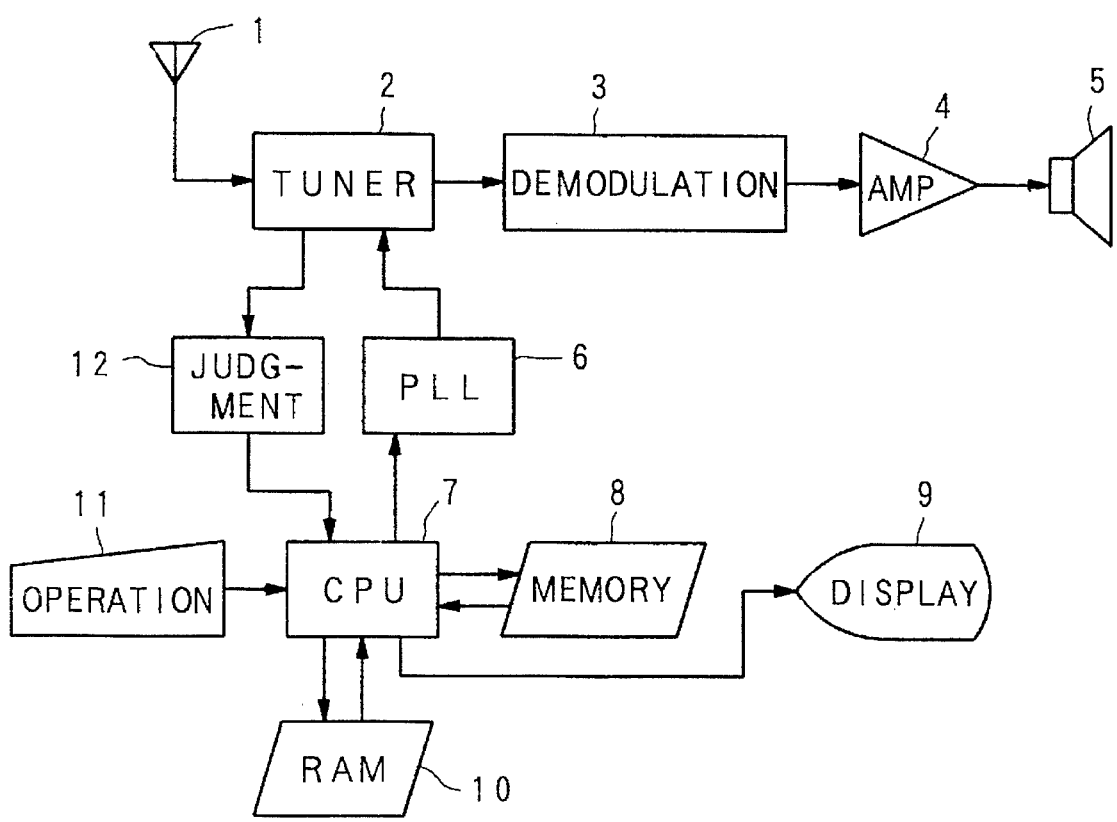
FIG. 1 is a block diagram of an automatic station selecting and receiving apparatus as an embodiment of the present invention.

FIG. 1 shows a construction of the first embodiment. In FIG. 1, an automatic station selecting and receiving apparatus is provided with: an antenna 1; an electric tuner 2; a demodulation circuit 3; an amplifier (AMP) 4; a speaker 5; a PLL (Phase Lock Loop) circuit 6; a CPU (Central Processing Unit) 7; a memory unit 8; a display unit 9; a RAM (Random Access Memory) 10; an operation unit 11; and a judgment circuit 12 for judging whether the reception is possible or not.

The antenna 1 receives electric waves from broadcasting stations, and converts them to high frequency electric signals. The electric tuner 2 includes a high frequency amplifier, a mixing circuit, a local oscillator, an middle frequency amplifier etc., and gets the received frequency to be in synchronization with the frequency corresponding to the phase lock frequency set in the PLL circuit 6, and outputs the middle frequency signal. The demodulation circuit 3 demodulates the middle frequency signal of the selected broadcasting station, and converts it to the audio signal. The amplifier 4 power-amplifies this audio signal. The speaker 5 converts this audio signal to the sound wave, and outputs it to the internal space of the automobile. The PLL circuit 6 mainly consists of a frequency synthesizer and a VCO (Voltage Controlled Oscillator), and converts the frequency at which the phase is locked under the control of the CPU 7. The CPU 7 recognizes the condition of the memory unit etc., and controls the whole system e.g. the receiving frequency, the input from the operation unit 11 and the output to the display unit 9. The memory unit 8 mainly consists of a ROM (Read Only Memory), and stores not only the program data etc. for normal receiving operation but also the frequency data and the broadcasting station name data related to the broadcasting stations which electric waves can be received with respect to each region in advance. The RAM 10 stores primary information necessary for the operation of the CPU 7 and the pointer block etc. to call regional information from the memory unit 8. The operation unit 11 is a unit for the user to input the data related to the grid or the new broadcasting station, and the basic operation information. The judgment circuit 12 judges whether the electric wave of the broadcasting station to be received is at a level enough to receive or not. For example, in case that the electric wave having a certain receiving frequency f is being received, if it is judged that the output level of the AGC (Automatic Gain Control) is not less than a predetermined value and that the level of the middle frequency signal reaches a predetermined level, the judgment circuit 12 sets a judgment signal related to the frequency f to be valid (e.g. to be "1" or "0").

The database of the format information related to the broadcasting stations is stored in a ROM etc. of the memory unit 8, and has a multiple layered structure. This multiple layered structure includes, for example, a large regional file to cover a large region (e.g. state information file), a middle regional file to cover a unit of each broadcasting station (e.g. main city vicinity region information file) and a grid file to which the regional information related to the broadcasting station per grids, which are obtained by dividing the whole region in the lattice-like manner.

The grid file has: a frequency field for specifying the frequency of each broadcasting station within the grid; a call sign field for indicating a call sign of the broadcasting station; a city pointer field for indicating a point address of a city file which stores the information related to the city indicating the location of the broadcasting station; a format field for storing the format information of music genre (i.e.

the information indicating the tendency of programs) related to the broadcasting station; and a grid number field for setting grid information which grid includes the broadcasting station. Since these files can be changed by exchanging the ROM, the broadcasting information can be adapted to any country or any region, which is a great advantage of the present invention.

The receiving apparatus performs the setting operation of the current grid and the automatic format scanning operation by use of this information. The automatic format scanning operation is performed within the current grid. This is because the total number of broadcasting stations stored in the memory unit 8 is generally quite large, so that it is not practical to search all of them. Therefore, it is rational that the receiving apparatus sets the current grid including the current position as a searching object area and performs the automatic format scanning operation only within this region.

The setting operation of the current grid is performed by an automatically setting operation. Here, the automatically setting operation is such an operation that, when the current grid updating operation is specified, the receiving apparatus searches for the strengths of the electric waves of the broadcasting stations, and then sets the grid which is estimated to correspond to the current position of the automobile as the current grid on the basis of the strengths of the electric waves.

Figure 2:
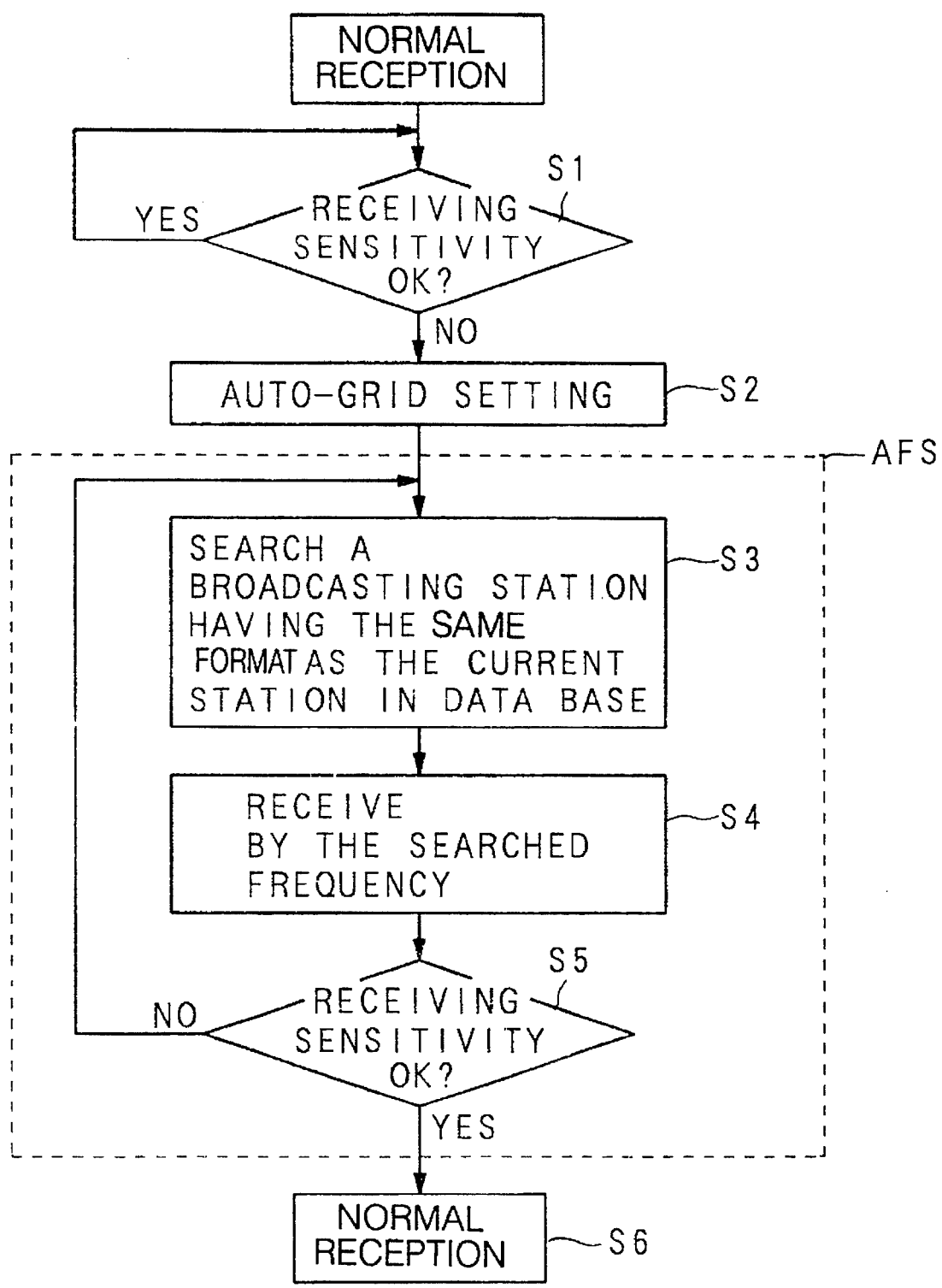
FIG. 2 is a flow chart showing an operation of the embodiment of FIG. 1.
Figure 3:
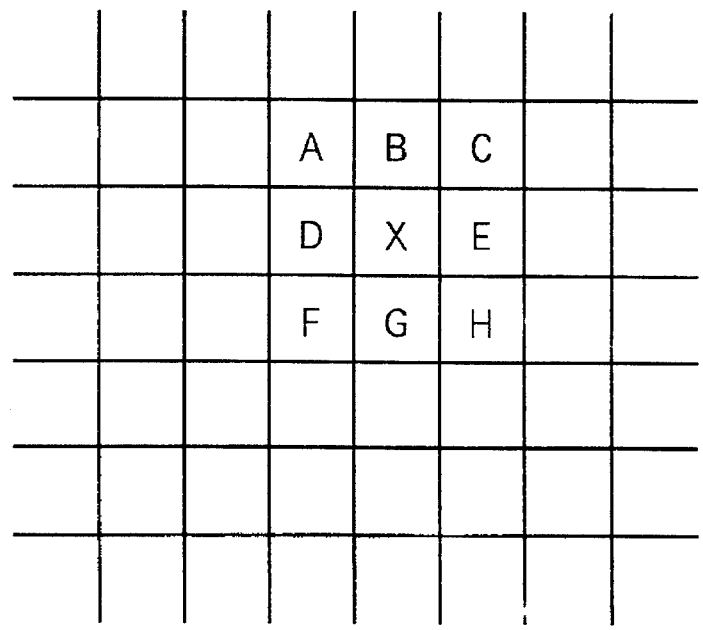
FIG. 3 is a schematic diagram showing a construction of grids for the automatic station selecting and receiving operation.
Figure 4:
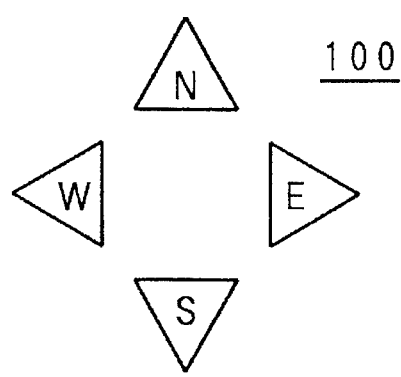
FIG. 4 is a plan view of an operation panel used in an automatic station selecting and receiving apparatus of a related art.

Nextly, the operation of the present embodiment is explained with referring to the flow chart of FIG. 2. At the initial condition, it is assumed that the current grid and the actual current position of the automobile i.e. the position where the receiving apparatus is currently positioned, are consistent with each other.

After turning on the electric power supply, the CPU 7 reads out the program from the predetermined area of the memory unit 8 and performs it. The CPU 7 performs the initialization of the whole system, and calls the frequency data which the receiving apparatus has been receiving until the previous time from the memory unit 8 to set it to the PLL circuit 6. The electric tuner 2 captures the synchronization with this set receiving frequency and selects the broadcasting electric wave corresponding to this. The resultant electric signal is then demodulated by the demodulation circuit 3, is power-amplified by the amplifier 4, and is supplied to the speaker 5 to be outputted as an audio sound.

Here, the user specifies the automatic format scanning operation. While the user is referring to the format information, which is displayed on the display unit 9, the user determines which music genre is desirable to be listened to continuously and inputs it through the operation unit 11. For example, when the user wants to listen to "Jazz", he pushes a key which specifies the "Jazz" on the operation unit 11. The CPU 7 detects this press on the key, and refers to the grid file of the memory unit 8 indirectly through the grid pointer which is set in the RAM 10. Then, from the records of the broadcasting stations, which exist in the current grid, the broadcasting stations having the format field to which the "Jazz" is set, are searched. The broadcasting stations which are searched and received in this manner, keeps broadcasting the Jazz music almost all day long, and the user can get his desired music.

Now, when the automobile starts to move, the distance between the broadcasting station from which the electric wave is received and the automobile is changed, so that the receiving condition of the receiving apparatus which is mounted on the pertinent automobile is also changed. In general, there exists a "service area" for each broadcasting station especially for the FM station. Since the range of this service area is in the range of tens of kilometers, when the automobile keeps moving for the order of several hours, the automobile goes beyond the service area and the receiving condition of the receiving apparatus is degraded.

At this time, the judgment circuit 12 keeps monitoring the signal level of the signal received at the electric tuner 2. Namely, the judgment circuit 12 keeps checking the receiving sensitivity of the electric tuner 2 is enough or not (step S1). If the level of the received signal is higher than a predetermined level (YES), the normal reception is continued without any problem. In this case, the judgment circuit 12 keeps the judgment signal to be valid (e.g. a high level).

However, when the actual position of the automobile is out of the current grid as the automobile moves, the signal level of the received signal of the inputted broadcasting electric wave is lowered. When the broadcast electric wave gets weak and the received signal is lower than the predetermined level (NO in the step S1), the judgment circuit 12 changes the judgment signal to be invalid (for example, a low level). The judgment of this predetermined level is executed when the output level of the AGC in the electric tuner 2 is not less than its threshold level and when the level of the middle frequency signal reaches its threshold level. This predetermined level is set to such a level that the noisy sound does not significantly inhibit the sound reproduction for the user when the user listens to the broadcast program in the internal space of the automobile and that the weakening of the received electric wave can be certainly detected.

The CPU 7 receives the judgment signal from the judgment circuit 12, and if the receiving sensitivity is not enough (NO in the step S1), the automatic grid setting operation is performed (step S2). Here, the automatic grid setting operation is an operation to set the current grid right above the current position when the current grid set in the RAM 10 and the current grid are not consistent with each other. For example, there is an automatic grid setting operation to examine the condition of the broadcast electric waves at the peripheral grids around the current grid, and the current grid is moved to the grid where the receiving condition is the best within these examined peripheral grids. Alternatively, there is an automatic grid setting operation to monitor and store the changing ratio of the receiving condition of each broadcasting station and determine the best grid on the basis of this changing ratio of the receiving condition of each broadcasting station, or on the basis of the changing ratios of the receiving conditions of the broadcasting station in each grid.

When the updating operation of the current grid is completed, the automatic format scanning (AFS) operation, which includes the steps S3 to S5, is started. Firstly, a broadcasting station, which has the same format information as that of the broadcasting station which electric wave is currently received i.e. the format information "Jazz", is searched in the database stored in the memory unit 8 (step S3). When the broadcasting station which has the same format "Jazz" is searched to be found out, the frequency recorded in the database for the pertinent broadcasting station is set to the PLL circuit 6, and the reception for the new broadcasting station is started. Namely, the receiving apparatus starts to receive the broadcast electric wave by the frequency of the searched station (step S4). Then, in order to examine the receiving condition of the new broadcasting station, the judgment result output of the judgment circuit 12 is examined just in case (step S5). If the receiving sensitivity for the new broadcasting station is judged to be enough (YES), the normal reception is resumed (step S6). If it is not judged to be enough (NO), the flow branches back to the step S3 and the automatic format scanning operation is started again. By the above operations, the user can receive the broadcast electric wave from the broadcasting station which mainly broadcasts the Jazz although the broadcasting station itself is different, so that he can enjoy his favorite Jazz music continuously as he has enjoyed.

As described above, according to the present embodiment, since the grid is reset before the format scanning operation, the broadcasting information for the format scanning operation can be always called from the right database. Further, even if the automobile on which the receiving apparatus is mounted is moved and the receiving condition is changed, the receiving apparatus automatically detects the degradation of the receiving condition and changes the region (grid) where the format scanning operation is performed, so that it is not necessary for the user to change the current grid each time when the noise is generated in his automobile. Furthermore, by setting the trigger level of the automatic grid setting operation to the noise level at which the user cannot recognize, the output of the noisy sound is prevented from being practically outputted, and the exchanging operation of the broadcasting stations having the same format to each other can be performed without the generation of the noisy sound.

As described above in detail, according to the present embodiment, since the timing of performing the automatic position control is set in accordance with the degradation of the receiving condition, the movement of the automobile can be detected at the best time, and the new search for the current position can be performed. Therefore, once the receiving apparatus is operated, it is not necessary for the user to specify the position for searching anymore, and the exact current position setting operation can be always maintained.

According to the present embodiment, since the automatic station selection of the new broadcast electric wave is performed right after the automatic grid setting operation, it is possible to always perform the automatic station selection of the new broadcasting station where the receiving condition is good without touching the panel of the operation unit.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An automatic station selecting and receiving apparatus mounted on a movable body comprising:
    a memory unit for storing information indicating a tendency of programs for each broadcasting station of a plurality of broadcasting stations and information indicating a broadcast frequency for each of the broadcasting stations in association with a plurality of regional blocks obtained by dividing a whole region, where the plurality of broadcasting stations exist;
    an operation unit for specifying a desirable tendency of programs to be received;
    a current block detection means for detecting one regional block and for maintaining a position where said movable body is currently positioned;
    a station selection means for selecting one of said plurality of broadcasting stations, which is associated with said one regional block detected by said current block detection means and which has the tendency of programs specified by said operation unit, according to the information indicating the tendency of programs stored in said memory unit; and
    a receiving means for receiving an electric wave of the broadcast frequency corresponding to said one of said plurality of broadcasting stations selected by said station selection means according to the information indicating the broadcast frequency stored in said memory unit,
    wherein said current block detection means comprises a judgment means for monitoring a signal level of the received electric wave and judging whether the monitored signal level is higher than a predetermined threshold level,
    said current block detection means re-detects one regional block if the judgment means judges that the monitored signal level is not higher than the predetermined threshold level, and
    said current block detection means detects a peripheral regional block if the judgment means judges that the monitored signal level is higher than the predetermined threshold level.

2. An automatic station selecting and receiving apparatus according to claim 1, wherein said station selection means re-selects one of said plurality of broadcasting stations, which is associated with said one regional block re-detected by said current block detection means.

3. An automatic station selecting and receiving apparatus according to claim 1, wherein said receiving means comprises an antenna, a tuner and a demodulation circuit, and said judgment means judges whether a signal level received at a tuner as the signal level of the received electric wave is higher than the predetermined threshold level or not.

4. An automatic station selecting and receiving apparatus according to claim 1, wherein the predetermined threshold level is predetermined as a function of a level of a noise generated in the received electric signal due to a distance from said automatic station selecting and receiving apparatus to the broadcasting station corresponding to the received electric wave.

5. An automatic station selecting and receiving apparatus according to claim 1, wherein said station selection means selects said one of said plurality of broadcasting stations by referring to the information indicating the tendency of programs for only the broadcasting stations associated with said one regional block detected by said current block detection means.

6. An automatic station selecting and receiving apparatus according to claim 1, wherein said current block detection means detects said one regional block by comparing the signal levels of electric waves from the broadcasting stations located in said one regional block with the signal levels of electric waves from the broadcasting stations located in other regional blocks around said one regional block.

7. An automatic station selecting and receiving method used for an automatic station selecting and receiving apparatus mounted on a movable body for selectively receiving one of electric waves from a plurality of broadcasting stations, said method comprising the steps of:
    storing information indicating a tendency of programs for each of the broadcasting stations and information indicating a broadcast frequency for each of the broadcasting stations in association with a plurality of regional blocks obtained by dividing a whole region, where the plurality of broadcasting stations exist, into a plurality of blocks;

specifying a desirable tendency of programs to be received;

detecting one regional block including a position where said movable body is currently positioned;

selecting one of said plurality of broadcasting stations, which is associated with the detected regional block and which has the specified tendency of programs, according to the stored information indicating the tendency of programs; and receiving an electric wave of the broadcast frequency corresponding to the selected one of said plurality of broadcasting stations according to the stored information indicating the broadcast frequency, wherein the regional block detecting step comprises the steps of: monitoring a signal level of the received electric wave and judging whether the monitored signal level is higher than a predetermined threshold level; re-detecting one regional block if the monitored signal level is not judged to be higher than the predetermined threshold level; and detecting a peripheral regional block if the monitored signal level is judged to be higher than the predetermined threshold level.

8. An automatic station selecting and receiving method according to claim 7, wherein the station selecting step comprises the step of re-selecting one of broadcasting stations, which is associated with the re-detected one regional block.

9. An automatic station selecting and receiving method according to claim 7, wherein the predetermined threshold level is predetermined as a function of a level of a noise generated in the received electric signal due to a distance from said automatic station selecting and receiving apparatus to the broadcasting station corresponding to the received electric wave.

10. An automatic station selecting and receiving method according to claim 8, wherein the current block detecting step comprises the step of detecting said one regional block by comparing the signal levels of received electric waves from the broadcasting stations, which are located in said one regional block with the signal levels of electric waves from the broadcasting stations, which are located in other regional blocks around said one regional block.

* * * * *